United States Patent [19]

Sauer

[11] 4,178,614
[45] Dec. 11, 1979

[54] READOUT OF A DENSELY PACKED CCD

[75] Inventor: Donald J. Sauer, Plainsboro, N.J.

[73] Assignee: RCA Corporation, New York, N.Y.

[21] Appl. No.: 936,524

[22] Filed: Aug. 24, 1978

[51] Int. Cl.² .................. H04N 3/14; H01L 27/10;
H01L 29/78; H01L 31/10
[52] U.S. Cl. .................................... 358/213; 357/24;
357/30; 307/221 D; 365/183
[58] Field of Search ................... 358/213; 357/24, 30;
307/221 D; 250/211 J; 365/183

[56] References Cited

U.S. PATENT DOCUMENTS

| 3,967,254 | 6/1976 | Kosonocky et al. | 307/221 D |
| 4,094,009 | 6/1978 | Schneider et al. | 357/24 |

OTHER PUBLICATIONS

Collins et al., "CCD and Photosensitive Devices," 1973 *IEEE International Solid-State Circuits Conference*, Feb. 15, 1973, pp. 136, 137 and 210.

*Primary Examiner*—John C. Martin
*Attorney, Agent, or Firm*—H. Christoffersen; Samuel Cohen

[57] ABSTRACT

High vertical resolution can be obtained in a charge-coupled device (CCD) imager of the field transfer type by integrating charge in the A register in storage potential wells separated by potential barriers, with no empty potential wells separating the storage wells. Transfer of the integrated charge from the A to the B register at a speed which meets commercial television standards is obtained by employing a new type of multiple-phase clocking. Starting with the first row of charges $S_j = S_1$, the clock pulses successively separate each row of charges $S_j$ from the following row $S_{j+1}$ by a space for a potential well and a potential barrier, and in synchronism with each such separation, the clock pulses shift the rows $S_{j-1}, S_{j-2} \ldots$, if any, which previously have been separated, in unison, all by one row position. Then, after the first row of charges $S_1$ from the A register reaches the first row of the B register it becomes statically stored there, and the process reverses, that is, the spaces between adjacent rows of charges successively are eliminated, to obtain high charge packing density in the B register and to completely empty the A register. Then the B-to-C register readout is accomplished in a manner similar to the first part of the A-to-B register readout.

5 Claims, 17 Drawing Figures

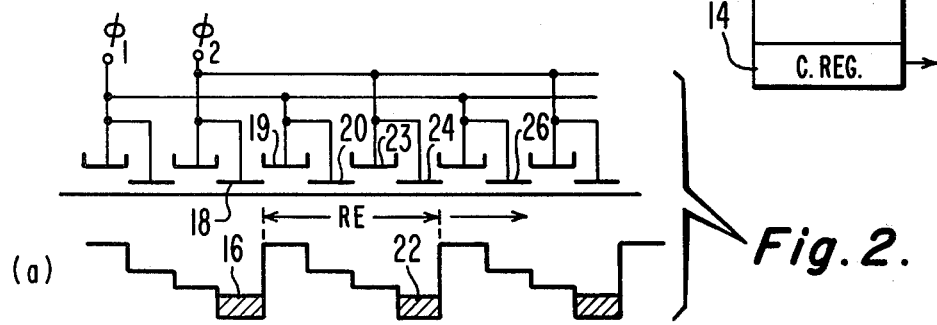
Fig. 1. PRIOR ART
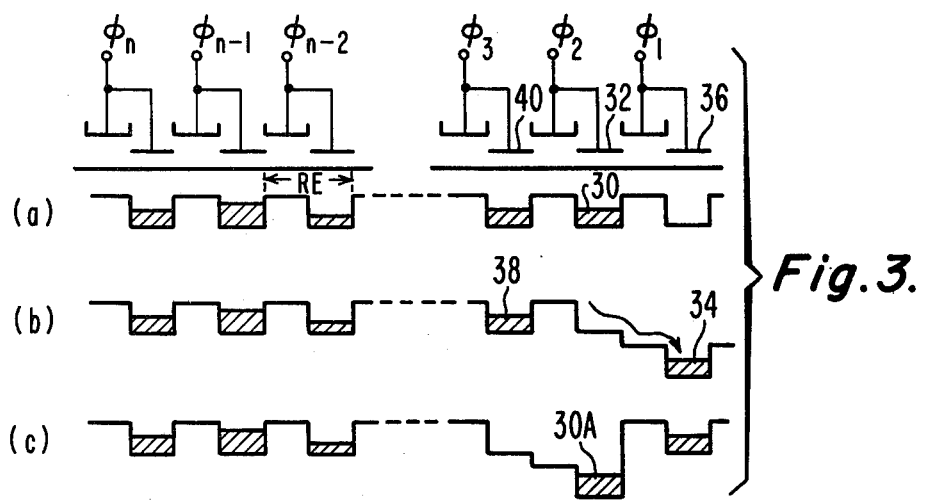
Fig. 2.
Fig. 3.
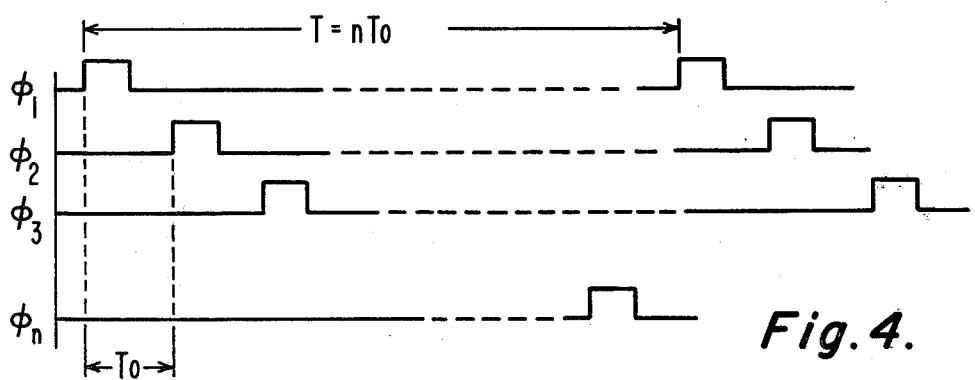
Fig. 4.

READOUT OF A DENSELY PACKED CCD

The present invention relates to charge-coupled devices (CCD's) and, in particular, to the high speed shifting of closely spaced, stored charge packets in such devices.

In the drawing:

FIG. 1 is a block diagram of a known CCD imager of the field transfer type;

FIG. 2 is a sketch which includes a portion of a column of the imager and a substrate potential profile, to explain one known mode of operating the imager of FIG. 1;

FIG. 3 is a drawing which includes surface potential profiles to illustrate another known mode of operating the imager of FIG. 1;

FIG. 4 is a drawing of waveforms employed during the operation depicted in FIG. 3;

Figure 5:
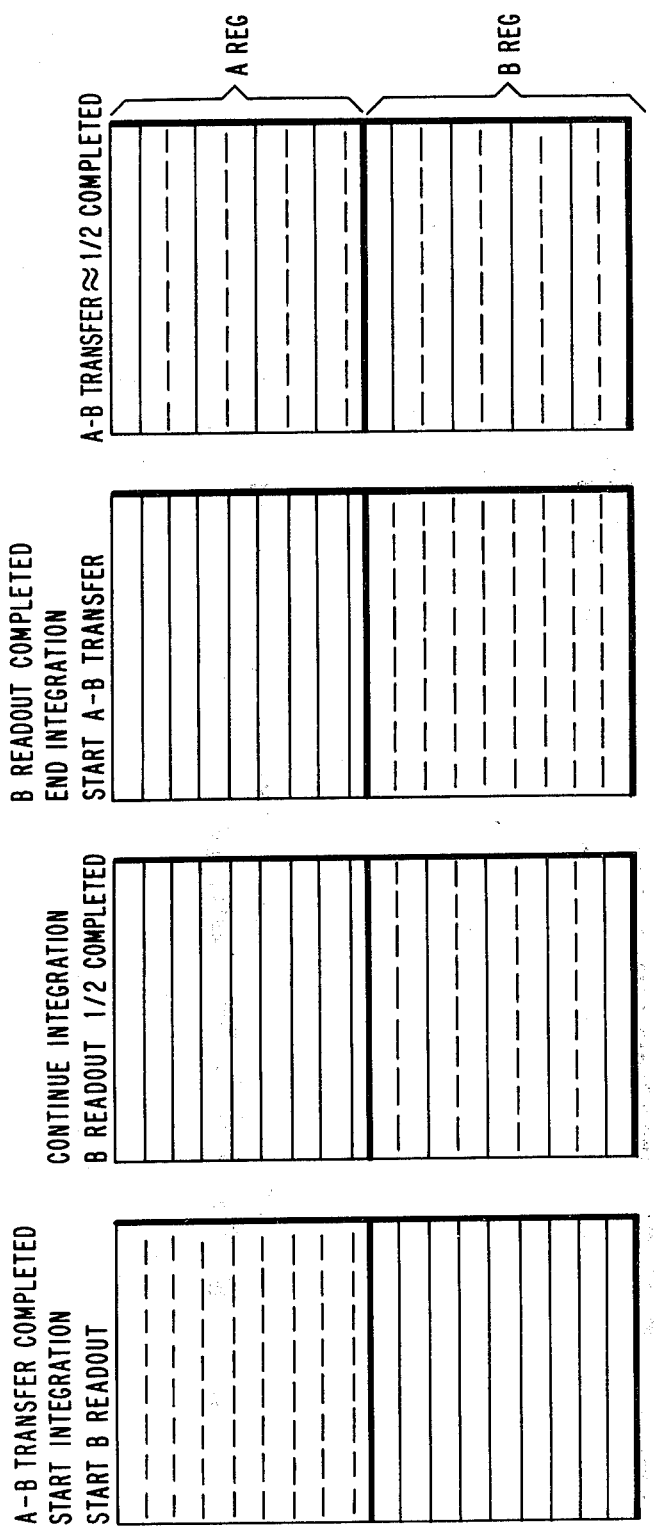
FIGS. 5a–5d illustrate a mode of operation embodying the invention of an imager of the field transfer type.

The known imager of the field transfer type illustrated in FIG. 1 includes a photo-sensing array 10 known as an A register, a temporary storage array 12 known as a B register, and an output register 14 known as a C register. The B and C registers are masked, that is, means are provided for preventing a radiant energy image from reaching either register.

The construction details of the imager of FIG. 1 are well known and will not be discussed here. One such imager commercially available from RCA Corporation is three-phase operated and has 320 columns and 512 rows (256 in the A register and 256 in the B register) and is known as the "Big Sid." For purpose of simplicity, however, the prior art imager to be discussed in connection with FIG. 2 will be assumed to be two-phase operated.

The operation of the imager of FIG. 1 is well understood. During a so-called integration time, a scene or other image is projected onto the A register. The light or other radiant energy of the image causes charges to be produced at the various locations of the A register in accordance with the radiation intensity reaching the respective locations.

Upon completion of the integration time, that is, during the vertical blanking interval of commercial television, the charge signals which have accumulated (a "field") are transferred, in parallel, in the column direction from the A to the B register by the application of multiple phase voltages. The charges subsequently are transferred, a row at a time, from the B register to the C register and after each row of charges reaches the C register, it is serially shifted out of the C register in response to shift voltages applied to the C register. The serial shifting of the C register occurs at relatively high speed (during a "line time" of commercial television). During the transfer of a field from the B to the C register, a new field may be integrated in the A register.

FIG. 2 illustrates a part of a column of the A (or B) register operated in two-phase fashion. An advantage of operation in the general way depicted, that is, with one charge packet stored per stage, is that during the A-to-B register transfer, all rows stored in the A register are shifted concurrently. Thus, for example, in response to the application of a $\phi_1$ pulse and the corresponding removal of a $\phi_2$ pulse, the charge packet in potential well 16 beneath electrode 18 will move to a new potential well created beneath electrode 20; concurrently, the charge packet 22 beneath electrode 24 will be shifted to a new potential well created beneath electrode 26 and so on. Assuming that vertical interlace is not employed, the vertical resolution in the A register is relatively low. During integration, charge can be stored only in each alternate row of the A register. Thus, if it is assumed that an electrode pair 19, 20 comprises part of one row and an electrode pair 23, 24 comprises part of another row, during the integration time charge is stored only in the well 22 beneath the row 23, 24. Put another way, one stage comprising two pairs of electrodes, can store only one charge, and of each pair of adjacent rows, only one row will integrate charge. One resolution element in the vertical direction is shown as RE and its size is that of one stage (two rows).

The resolution can be doubled by using so-called electrode-per-bit clocking as illustrated in FIGS. 3 and 4. With electrode-per-bit clocking, during the integration time each row of the A register is biased relatively to the substrate so that a potential well is present. The number of phases required for n rows in the A register (and a corresponding number of rows in the B register) is n.

The multiple-phase voltages are non-overlapping as illustrated in FIG. 4. FIG. 3 illustrates at a the charges which have accumulated during the integration time. Assume that the imager is of the P substrate, surface-channel type. When $\phi_1$ goes positive as illustrated at b in FIG. 3, the charge stored in potential well 30 beneath $\phi_2$ electrode 32 propagates to the deeper potential well created beneath $\phi_1$ electrode 36 (this electrode may be the topmost electrode in the B register or it may be the bottommost row of the A register which would be a masked row. The charges in the remaining rows of the A register are not disturbed. During a following time period when $\phi_2$ goes positive, the charge stored in a potential well 38 beneath a $\phi_3$ electrode 40 propagates to the deeper potential well 30A created beneath electrode 32, and so on.

The important advantage achieved employing storage as illustrated and electrode-per-bit clocking for readout, is that the resolution in the vertical direction is increased by a factor of 2. The resolution element RE shown in FIG. 3 occupies only the length of one row (the dimension in the charge propagation direction of one pair of electrodes), which is half the size of the resolution element obtained using the mode of operation discussed in connection with FIG. 2. However, this increased resolution is obtained at a high price, namely at a severe reduction in operating speed. To shift the entire contents of the A register by one row requires n clock pulses, whereas in the arrangement of FIG. 2 the contents of the A register is shifted one row in response to only a single clock pulse. The implications of this are discussed in the paragraphs which follow.

As the clock pulses employed for electrode-per-bit (E/B) clocking are non-overlapping, for a given line rate $F_L=1/T$, the period $T_O=T/n$ of the individual pulses must decrease as n increases. This requires faster rise and fall times for the pulses and therefore a higher current driver for each phase electrode pair. Because n is typically greater than 100, a practical E/B clocking scheme must have the clock drivers integrated on the same chip as the imager. The A-to-B field transfer time available in commercial television (using NTSC standards) is about 1 millisecond (ms) maximum. Since n lines must be transferred in 1 ms, $T_O=1$ ms/$n$2. The term $n^2$ is arrived at by considering that it requires n clock pulses to shift a field one position (one row) and there are n rows per field. For n=100, $T_O=0.1$ microsecond ($\mu$s), which implies that the clock pulses must have a width of about 50 nanoseconds (ns) with 20 ns rise and fall times. For a typical capacitance of 30 picofarads (pF) per phase electrode, this would require 100 on-chip clock drivers, each with greater than 15 milliampere (mA) drive capability which is not practical. In addition to the excessively high current requirements imposed by such a scheme, the propagation of the clock pulses down a row gate electrode (in practice, such a gate electrode may be formed of polysilicon and may have a length of 200 mils and a resistivity of 50 ohms per square) requires at least 400 ns. It should be clear from this discussion that normal E/B clocking as discussed in connection with FIGS. 3 and 4 is not feasible for use with a high resolution CC imager such as described, if it is desired that the imager operate with NTSC commercial television standards. It should be kept in mind that in the example discussed here, n, the number of rows, is assumed to be 100, whereas in practice, a substantially greater number of rows is desired. For example, the Big Sid imager mentioned above has 256 rows in each of the A and B registers.

The problems discussed above are overcome by employing a clocking arrangement embodying the invention to obtain the kind of A-to-B transfer illustrated in FIGS. 5a –5d. The A register is assumed to have n=8 rows and the B register n=8 rows. There is a transfer electrode (not shown) separating the bottommost row, hereafter termed the first row of the B register from the C register. FIG. 5a illustrates the start of an integration time. The A register is empty. Each row of the B register includes charge. The way in which the transfer occurs will be discussed shortly. The B-to-C readout starts; however, none of the rows has yet been read out of the B register.

FIG. 5b illustrates that during the integration, charges are integrated under each row of the A register. While the integration continues, the B register is being read out. The clocking waveforms are such, as will be discussed in detail shortly, that first the charge in the bottom row (the first row) in the B register is shifted via the transfer electrode into the C register, leaving the first row empty. Next, the second row of charge $S_2$ is shifted into the first row leaving the second row empty. Next, the rows of charges $S_2$ and $S_3$ concurrently are shifted one row down, the charges $S_2$ passing into the C register and the charges $S_3$ becoming stored in row 2, leaving row 3 empty. Each time a row of charge $S_j$ becomes separated from a preceding row of charge $S_{j+1}$ by an empty row, the row of charge $S_j$ and all previously separated rows of charge $S_{j-1}, S_{j-2}$... are shifted in unison. This process continues until half of the B register is empty. At that time, charge is present under each alternate row of the B register and the remaining alternate rows of the B register are empty of charge, all as illustrated in FIG. 5b.

After the B register is half emptied, as shown in FIG. 5b, the shift pulses cause all rows to shift concurrently by one row position at a time. The process continues until the B register is empty as shown in FIG. 5c. When the B register is empty, the A-to-B transfer starts. The time between the start of the integration (FIG. 5a) and the end of integration (FIG. 5c), which corresponds to the time employed for the B-to-C transfer, is about 1/30 of a second and corresponds to a frame time of television (in this illustration, it is assumed that there is one field per frame).

The start of the A-to-B transfer is accomplished in a manner similar to the B-to-C transfer just discussed. FIG. 5d illustrates where the charges are located after the A-to-B register transfer is half completed. Alternate rows of the A register store charge and alternate rows of the B register store charge. When the first row of charges $S_j=S_1$ of the A register reaches the 1' st row of the B register, which occurs in the shift period following what is shown in FIG. 5d, it becomes temporarily statically stored in the 1'st row of the B register. As each row of charges $S_{j+1}$ approaches a row of charges $S_j$ statically stored in the j'th row of the B register, it becomes temporarily statically stored in the adjacent row, that is, the (j+1)'th row of the B register. Upon the completion of the A-to-B transfer, the charges are all statically stored as shown in FIG. 5a. Now the A register is completely empty and the B register is storing charges in each row. The time from the end of the integration, that is, from a period starting with the charge configuration as appears in FIG. 5c until the time that the A-to-B transfer is completed, that is, the time with the charge configuration as it appears in FIG. 5a, is the vertical retrace time of television which is about 1,000 $\mu$s=1 ms.

Figure 6:
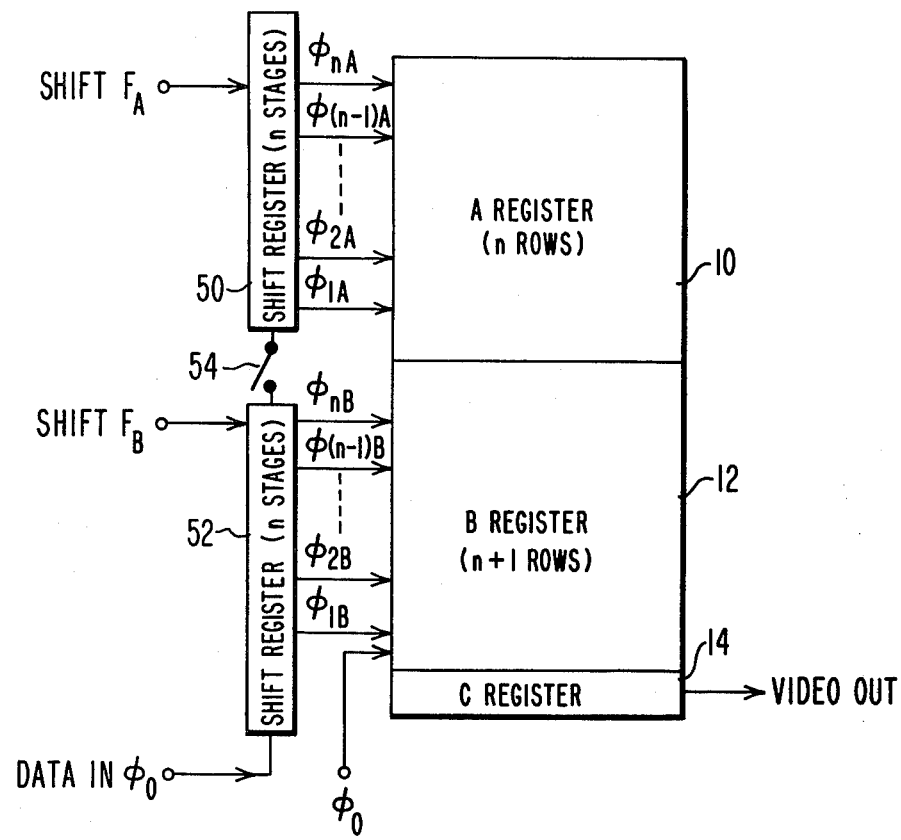
FIG. 6 is a block diagram of a CCD imager of the field transfer type embodying the invention.

A system embodying the invention is illustrated in FIG. 6. The A, B and C register 10, 12 and 14 are similar to those of the prior art. The system includes also an n stage shift register 50 for clocking the A register and an n stage shift register 52 for clocking the B register. These registers may be conventional shift registers such as transistor shift registers, for example, or they may be CCD shift registers. An example of a commercially available CMOS shift register which may be employed, which includes asynchronous ripple-type set and reset capability is the RCA CD4062 200-stage dynamic shift register. Register 50 is clocked by shift pulses $F_A$. Register 52 is clocked by shift pulses $F_B$. Data input pulses $\phi_O$ are applied to the input end of shift register 52. These same data pulses are employed to operate the transfer electrode (below the first row) in the B register. The A register has n rows.

During the shifting of charges from the B to the C register, the switch 54 is open. In practice, this switch is an electronic switch but for purposes of illustration, is shown as a mechanical switch. During the A-to-B register transfer, switch 54 is closed and the same clock pulses are used for $F_A$ and $F_B$.

The shift registers operate according to the following convention. The pulses $F_A$ and $F_B$ are positive pulses. In response to each lagging edge of a positive $F_A$ or $F_B$ pulse, a transition occurs in the output clock pulses. The leading edge of each positive pulse $\phi_O$ is coincident with the lagging edge of each positive pulse $F_B$ and terminates at the lagging edge of the following pulse $F_B$. For example, in FIG. 8A, the leading edge of the (1) $\phi_O$ pulse occurs with the lagging edge of the (0) $F_B$ pulse; the lagging edge of the (1) $\phi_O$ pulse occurs with the lagging edge of the (1) $F_B$ pulse. When the lagging edge of $\phi_O$ occurs, the following stage becomes set so that $\phi_{1B}$ goes positive. The lagging edge of the (2) shift pulse $F_B$ resets the $\phi_{1B}$ stage and sets the following ($\phi_{2B}$) stage so that $\phi_{1B}$ goes relatively negative and $\phi_{2B}$ goes relatively positive. Concurrently, with the lagging edge of the 2 shift pulse $F_B$, a new data pulse (2) $\phi_O$ is supplied to the shift register, and so on.

Figure 7:
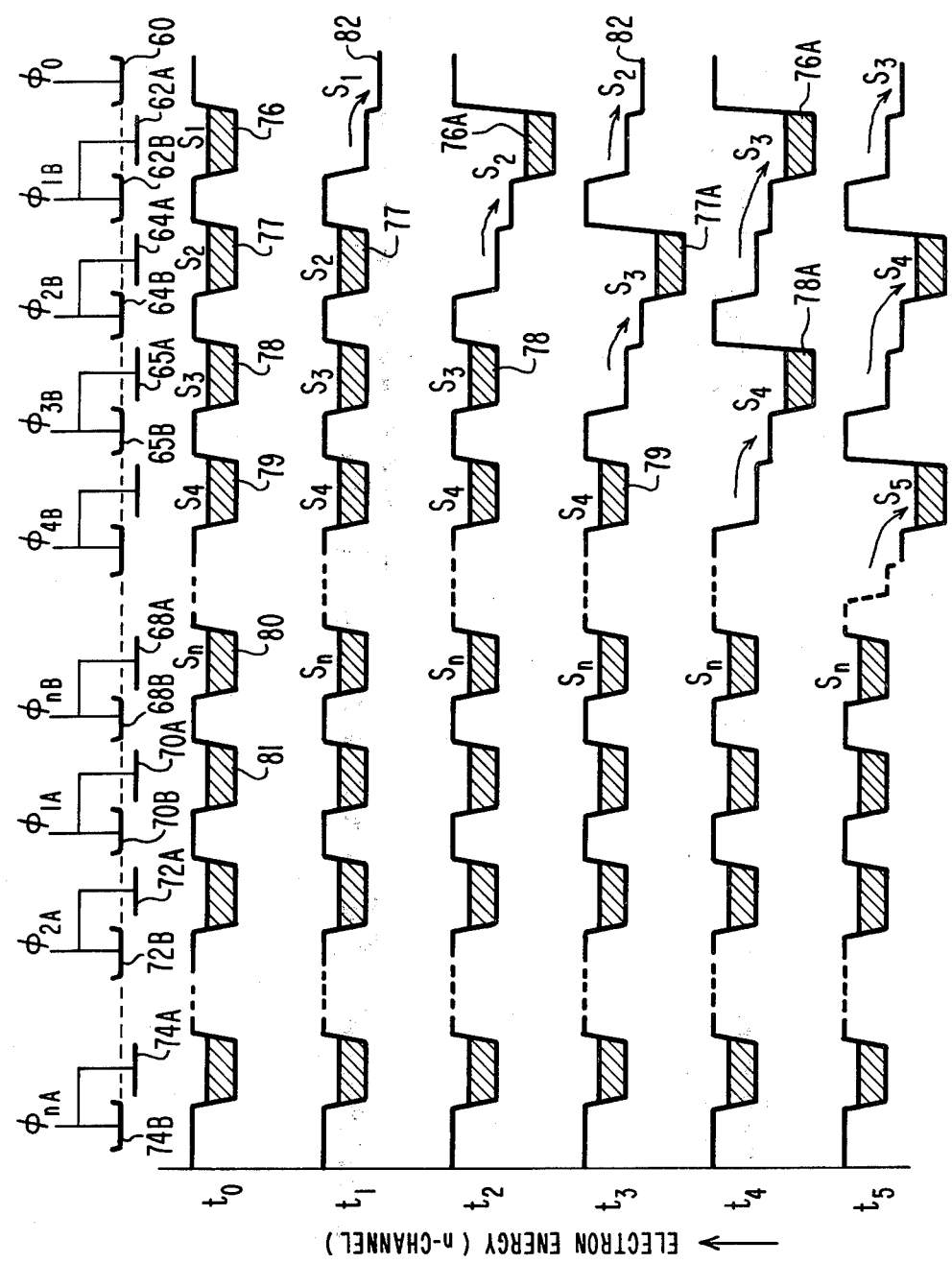
FIG. 7 is a drawing of surface potential profiles to help explain the operation of the imager of FIG. 6.
Figure 8A:
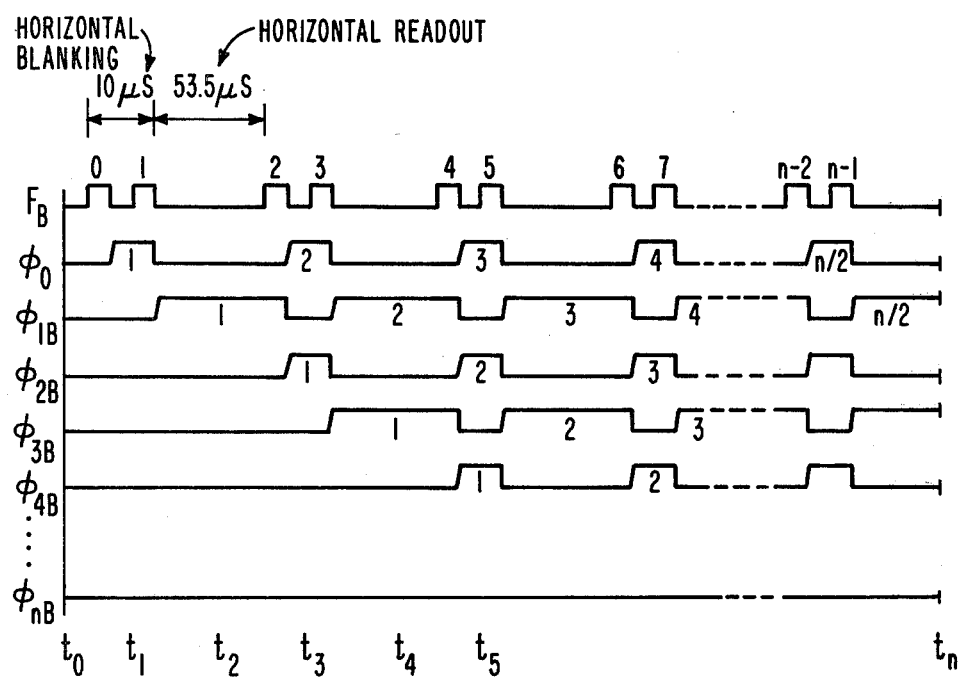
FIGS. 8a and 8b are drawings of waveforms employed in the operation of the imager of FIG. 6.
Figure 8B:
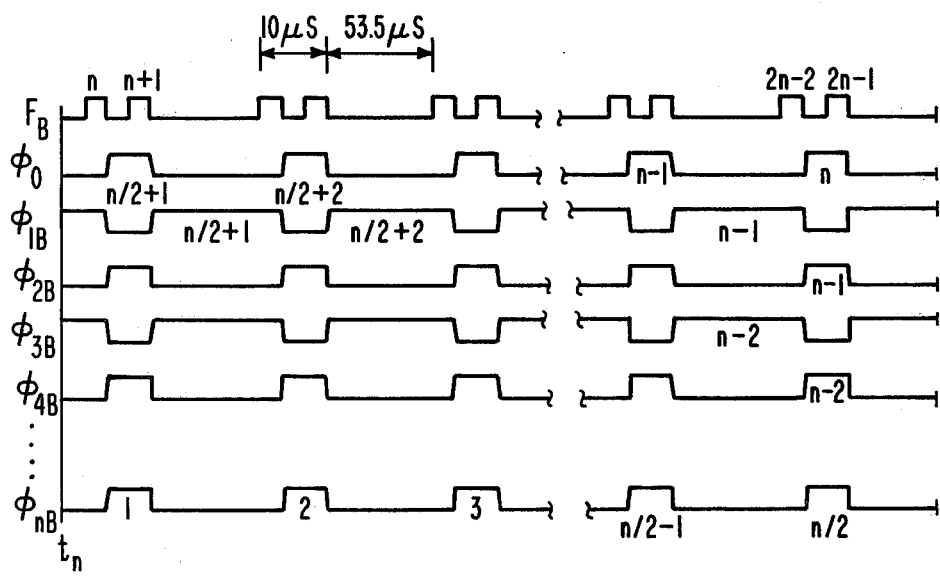

In the discussion of the operation which follows, FIGS. 7, 8a and 8b should be referred to. Assume that at time $t_0$ the situation is as depicted in FIG. 5a. In other words, the A-to-B transfer has been completed. This means that all rows in the B register are storing charge. The A register presumably is empty; however, since integration is starting, there are charges shown under the electrodes of the A register. Referring to FIG. 7, the transfer electrode for the B register is the single electrode 60 which receives the $\phi_O$ clock. All the other electrodes in the A and B registers comprise electrode pairs. Thus the first row in the B register, which is the bottommost row storing charge, comprises electrode pair 62A, 62B, where 62A is a storage electrode and 62B a transfer electrode. (For purposes of this discussion, the electrodes are shown spaced different distances from the substrate; however, other means for obtaining the potential well and barrier may be employed instead. For example, one could use ion implants in the substrate, or a voltage offset between the two electrodes of each pair.) The second row of the B register is represented by electrode pair 64A, 64B and so on, the last row of the B register comprising electrode pair 68A, 68B. The same figure shows the first row of the A register represented by electrode pair 70A, 70B which is followed by electrode pair 72A, 72B and so on, the last row of the A register being represented by electrode pair 74A, 74B. The substrate is biased so that during integration there is a potential well present beneath each storage electrode of the A register.

In operation, at time $t_0$ there are charge packets S1, S2, S3 and so on in the respective potential wells 76, 77, 78 and so on. Referring to FIG. 6, switch 54 is open. The shift pulses $F_B$ start and the "data in" pulses $\phi_O$ are applied. As in the previous discussion, the assumption is that the imager is of the surface channel type and has a P substrate (n channel) and that relatively positive pulses applied to the electrodes cause potential wells to form. The first shift pulse $F_B$, shown as the zeroth pulse in FIG. 8a, applied to shift register 52 does not cause anything to occur as there is no data yet in the shift register. At time $t_1$, the first $\phi_O$ pulse is present. It is applied as a data input to the shift register 52 and also as a clock pulse to electrode 60. At time $t_1$, while this clock pulse $\phi_O$ is present, the first charge packet S1 in well 76 propagates to beneath the deeper well 82 created beneath electrode 60 and from there to the C register. The transfer to the C register occurs in response to clock pulses applied to appropriate electrodes of the C register. This corresponds to the shifting of the first row in the B register to the C register. Thereafter, during the following part of the horizontal line time (53.5 $\mu$s), this row is shifted serially out of the C register in conventional fashion. This row comprises the video signals which will be displayed as the first row on the television screen. Note also that the shifting of the row from the B to the C register occurs during the horizontal blanking time (10 $\mu$s of television).

After the zeroth $F_B$ shift pulse starts and terminates, the following shift pulse labelled "1" in FIG. 8, occurs. In response to the lagging edge of this shift pulse, $\phi_{1B}$ goes high and $\phi_O$ goes low at the same time. By the time $t_2$, which is during the time $\phi_{1B}$ is high, the second row of charges have been shifted, as depicted by the shifting of the charge packet S2 formerly in well 77 to the deeper well 76A created beneath storage electrode 62A by $\phi_{1B}$ being high.

At time $t_3$, after the next $F_B$ shift pulse 2 has occurred, $\phi_O$ again is high, $\phi_{1B}$ is low and $\phi_{2B}$ has gone high. As shown in FIG. 7 at $t_3$, these voltage levels have caused the S2 charge packet to be shifted via potential well 83 to the C register. This is the second row of information which will be displayed on the television screen. Concurrently, the next charge packet S3 has shifted from potential well 78 to the deeper potential well 77A created beneath electrode 64. So in response to the conditions at time $t_3$, two rows of charges have concurrently been shifted. Note that at time $t_3$ there is an empty row beneath electrode pair 62A, 62B and an empty row beneath electrode pair 65A, 65B.

By the time $t_4$, $\phi_O$ again is low, $\phi_{1B}$ is high, $\phi_{2B}$ is low and $\phi_{3B}$ is high. The result shown in FIG. 7 is the shifting of charge packet S3 to potential well 76A, that is, one row down and the concurrent shifting of charge packet S4 from the potential well 79 to the deeper potential well 78A. The charge packets S3 and S4 are now spaced by an empty row and the charge packet S4 is spaced from the preceding charge packet (not shown) also by an empty row. The process continues until the B register is half empty. By that time, charges are present only in alternate rows of the B register and the remaining alternate rows are empty as depicted schematically in FIG. 5b. Note that while the shifting starts from the B to the C register with only a single row of the B register being shifted, as the shifting proceeds, more and more rows are concurrently shifted. For example, immediately after the time shown in FIG. 5b in which there are n/2 rows remaining in the B register, all n/2 of these rows will be shifted concurrently one row down.

It may be observed from FIG. 8a that each time a $\phi_O$ pulse occurs, a row of charges is shifted out of the B register. Two $F_B$ shift pulses occur each time one $\phi_O$ pulse occurs. By the time the B register is half empty, (n/2) $\phi_O$ pulses have occurred and n $F_B$ shift pulses have occurred (assuming that there are n rows in the B register).

FIG. 8b illustrates the continuation of the process described above. After the n'th shift pulse $F_B$, the $\phi_{nB}$ level, which is the level applied to the last row of the B register, goes high. By the time the 2n'th shift pulse $F_A$ (the one legended 2n-1 is the 2n'th such pulse) and the n'th $\phi_O$ pulse occur, the B register is empty, that is, the row of charges which initially was stored in the last ($\phi_{nB}$) row of the B register has now been shifted from the first ($\phi_{1B}$) row of the B register to the C register. It is now time to start the A-to-B register transfer.

Figure 9:
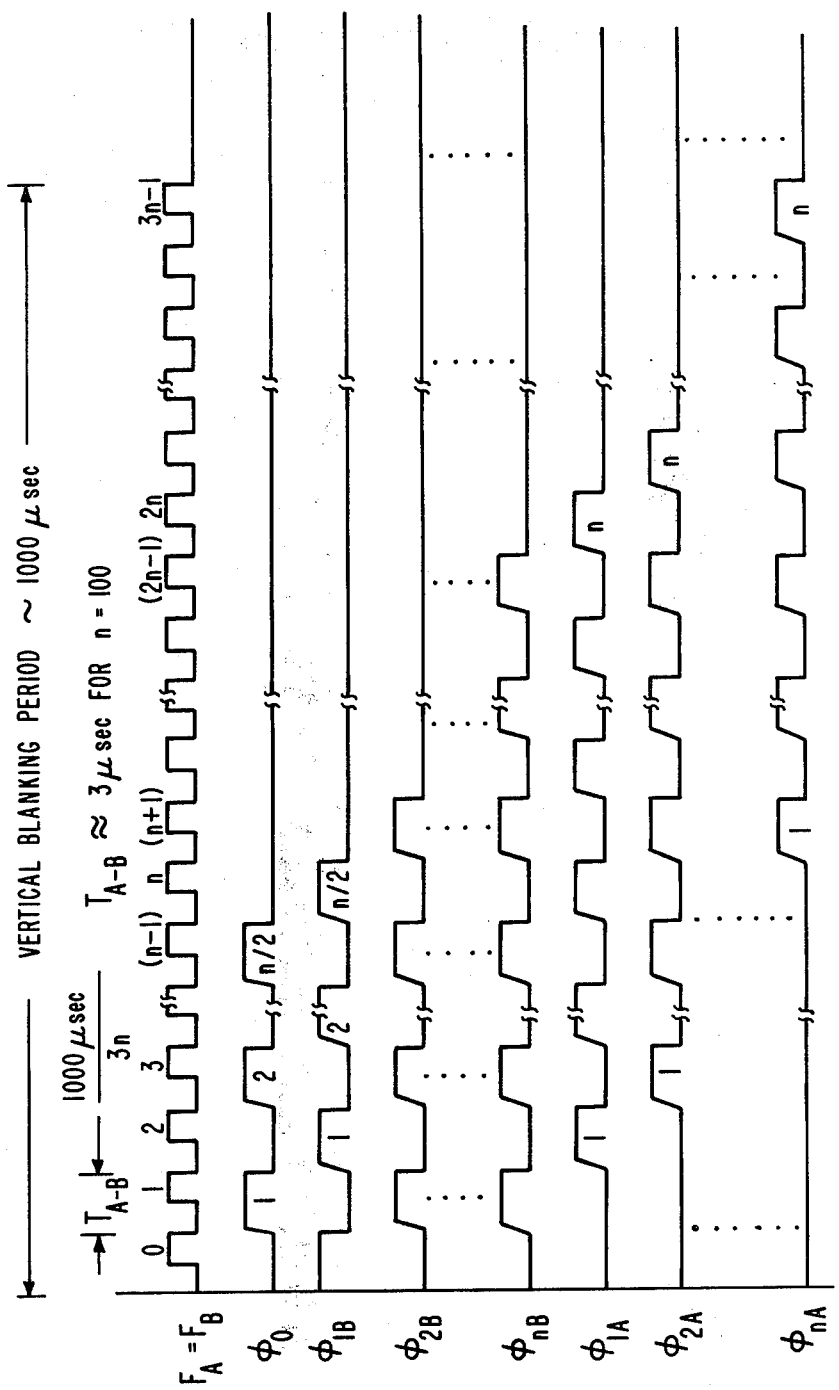
FIG. 9 is another drawing of waveforms employed during the operation of the CCD imager of FIG. 6.

The waveforms for the A-to-B register transfer are shown in FIG. 9. During this transfer, switch 54 is closed. Also, the clock pulse source supplies the same clock pulses $F_A=F_B$ to both shift registers 50 and 52. The timing of these clock pulses is different than that of the previous clock pulses. Assume n=100 and assuming a vertical blanking or retrace period of approximately 1,000 μs, each period $T_{A-B}$ of the shift register clock pulses, will be about 3 μs. The reason is that, as will be shown shortly, it requires (in one embodiment) 3n such shift pulses to complete the transfer, that is, to go from the condition shown in FIG. 5c to the condition shown in FIG. 5a, and 1000/3n≅3.

After the 2n shift pulses $F_B$ employed to complete the B-to-C register transfer, the shift register 52 is storing (n/2) bits, one such bit in every alternate stage of the shift register. In terms of output voltage levels, each alternate output voltage of the shift register is high and the remaining outputs are low. Thus, $\phi_{2B}$ is high as are $\phi_{4B}$, $\phi_{6B}$, etc. The shift register 50 initially is empty. Now a total of (n/2) $\phi_0$ data bits are loaded into the shift register 52, as indicated in FIG. 9. This loading occurs during the first n shift pulses $F_A$ and $F_B$. During this loading, the data bits stored in the shift register 52 are being applied through switch 54 to the shift register 50.

Starting at the beginning of the loading, after the zeroth shift pulse $F_A=F_B$, $\phi_{1A}$ is low and $\phi_{nB}$ is high. This causes the transfer of the last ($\phi_{1A}$) row of charges from the A register to the last ($\phi_{nB}$) row of the B reigster. The first row of the A register is now empty.

After the 1 shift pulse $F_A=F_B$, $\phi_{1A}$ goes high so that the second row of charges in the A register transfer to the first row of the A register. The second last row of the A register is now empty.

In response to the lagging edge of the 2 shift pulse $F_A=F_B$, $\phi_{2A}$ goes high, $\phi_{1A}$ goes low, $\phi_{nB}$ goes high, $\phi_{(n-1)B}$ (not shown) goes low, $\phi_{(n-2)B}$ (not shown) goes high and so on. When $\phi_{2A}$ goes high, charge in the third ($\phi_{3A}$) row of the A register transfers to the second ($\phi_{2A}$) row of the A register. Charge from the $\phi_{1A}$ row of the A register transfers to the $\phi_{nB}$ row of the B register and so on.

The process above continues until by the time the n−1 $F_{A=FB}$ shift pulse occurs, charges are stored in every other row of the A register starting with the last or $\phi_{nA}$ row. Charges also are stored in every other row of the B register. Note that during the period from the zeroth to the n−1 $F_A=F_B$ pulse (a total of n such pulses), all of the rows of the B register have been clocked and more and more of the rows of the A register are clocked. By the time the n−1 $F_{A=FB}$ shift pulse has arrived, all of the rows of the A register, except for the last row have been shifted.

The data pulses $\phi_0$ stop after a total of n $F_A=F_B$ pulses have arrived, that is, when the pulse legended n−1 terminates. At this time, no charge is present under the $\phi_0$ electrode. During a following time period, that is, the period of the $F_A=F_B$ pulse legended n, the last $\phi_{1B}$ pulse occurs. This shifts a row of charges into the $\phi_{1B}$ row of the B register. This row of charges will now remain stored in the B register until the B register is full. The $\phi_{2B}$ pulse terminates with the termination of the $F_A=F_B$ clock pulse legended n+1. When the $\phi_{2B}$ pulse terminates, there is stored beneath the $\phi_{2B}$ electrode, a row of charges which formerly were present in the $\phi_{2A}$ row of the A register, that is, which were present in the $\phi_{2A}$ row at the end of the integration time. This process continues until the last $\phi_{nB}$ clock pulse terminates. This occurs at the lagging edge of the $F_A=F_B$ shift pulse legended 2n−1, which is actually the 2n'th shift pulse. When the $\phi_{nB}$ pulses terminate, the B register is fully loaded with charges in each row of the B register. This corresponds to the condition shown in FIG. 5a.

If the shift register 50 were now empty, the B-to-C register readout could occur. In one mode of operation, this emptying can be accomplished by employing an asynchronous reset pulse which clears the entire shift register 50. This requires the kind of shift register 50 having an asynchronous clear terminal. FIG. 9 illustrates an alternative mode of operation. This is simply to continue shifting the registers 50 and 52 (actually 52 is empty but the shifting does not harm anything) until the n/2 bits stored in register 50 are shifted out of this register. This requires roughly 300 μs or n $F_A=F_B$ clock pulses.

It was previously stated that if electrode-per-bit clocking were employed for the A-to-B register transfers as illustrated in FIGS. 3 and 4, the multiple-phase voltages applied to the A and B registers would consist of non-overlapping pulses each having a duration of roughly 100 ns. This 100 ns includes a 20 ns rise and 20 ns fall time. As can be seen from FIG. 9, the shift pulses employed in the present invention are each roughly 3 μs in duration, including the rise and fall times. Thus, the present shift pulses are roughly a factor of 30 longer than using E/B clocking (using similar assumptions as to parameters such as vertical blanking period, value of n, and so on). The present clock pulses are pratically realizable in conventional ways. Therefore, it is possible, using the approach of the present invention, to achieve high vertical resolution in the CCD imager and still to operate under NTSC television standards. If more lines than 100 are employed, the multiple-phase shift pulses must be shorter but they still must be practically realizable. For example, with an imager having 300 rows in each of the A and B registers, the period $T_{AB}$ will be somewhat over 1 μs and this is still within the state of the art. Further, if asynchronous reset is employed for the shift register 50, only 2n (rather than 3 n) shift pulses $F_A=F_B$ will be needed and the clock pulses $\phi_0$, $\phi_{1B}$...$\phi_{nA}$ can all be increased in width by a factor 5/3.

Figure 6A:
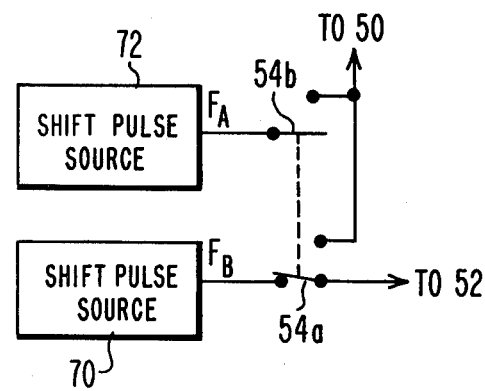
FIG. 6A shows an arrangement for supplying shift pulses to the imager of FIG. 6

FIG. 6A shows schematically one possible arrangement for supplying the $F_A$ and $F_B$ shift pulses. The switches 54a and 54b may be ganged with the switch 54 of FIG. 6. In the positions shown, the shift pulse source 70 which supplies the $F_B$ pulses, connects to register 52. Switch 54 is open and shift pulse source 72 is disconnected from register 50 by open switch 54b. During the A-to-B transfer, the switches are thrown to their second position. The clock pulse source 72 now supplies the pulses $F_A$ to both registers 50 and 52 and switch 54 is closed. It is to be understood, of course, that the showing of FIG. 6A is schematic and that, in practice, the sources 70, 72 can comprise integrated circuits and the various switches electronic switches.

Figure 10:
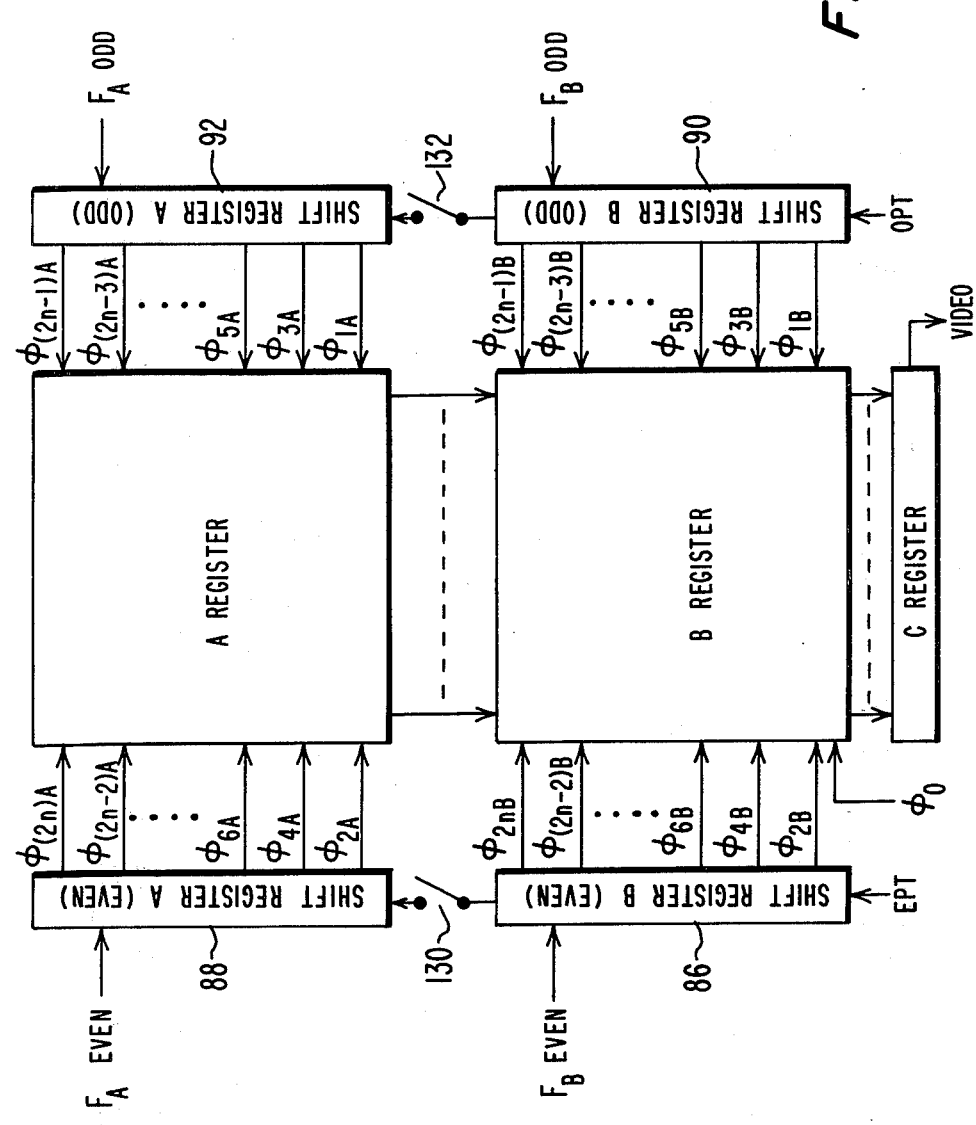
FIG. 10 is a block diagram of a CCD imager of the field transfer type according to a second embodiment of the invention.

FIG. 10 illustrates a "four-phase" embodiment of the invention. It includes shift registers 86 and 88 which connect to the even rows of the B and A registers, respectively, and shift registers 90 and 92 which connect to the odd rows of the B and A shift registers, respectively. The shift register 86 receives an even pulse train (EPT) and the shift register 90 an odd pulse train (OPT). The four registers 86, 88, 90, 92 also receive $F_B$ EVEN, $F_A$ EVEN, $F_B$ ODD and $F_A$ ODD shift pulses, respectively. The relative phasing of these various pulse trains during the B register readout is illustrated in FIG. 12.

Figure 11:
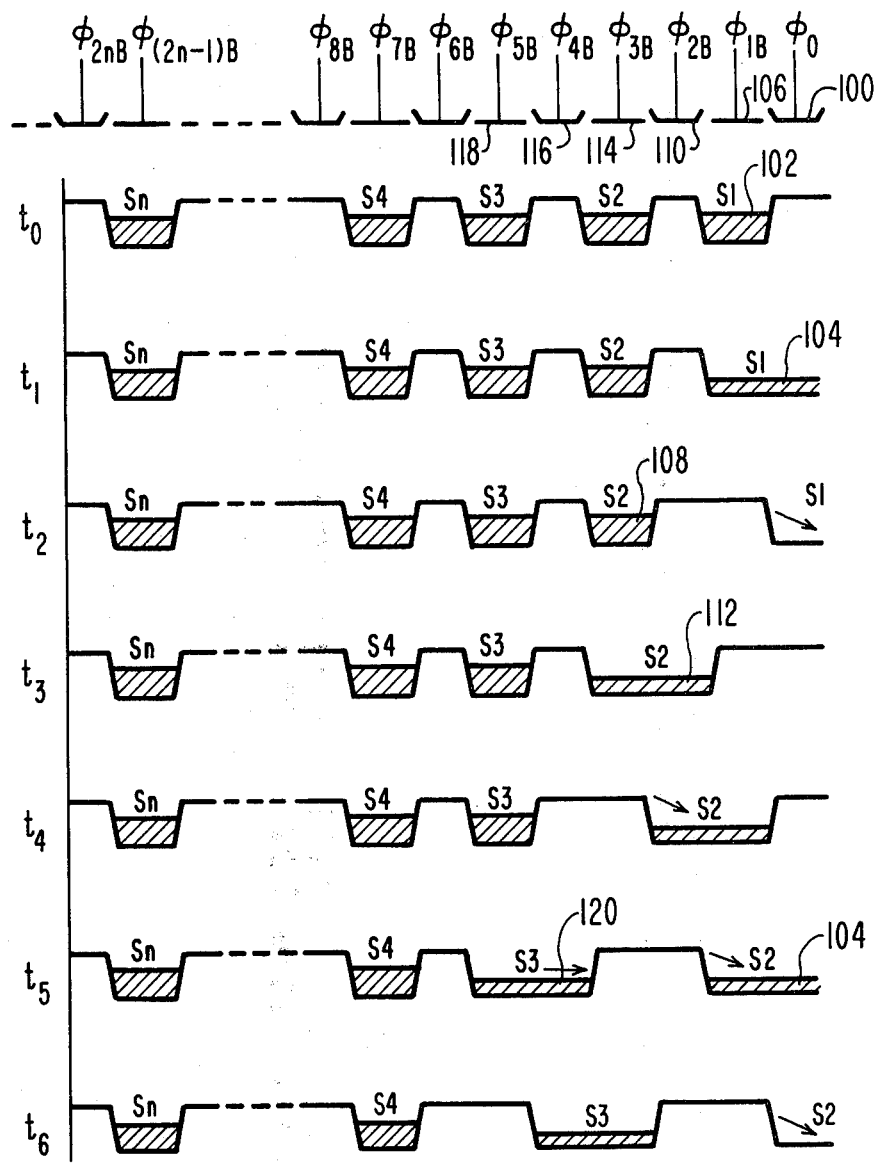
FIG. 11 is a drawing of surface potential profiles to help explain the operation of the imager of FIG. 10.

The electrode structure of the B register is illustrated in the surface potential diagram of FIG. 11. Note that the B register includes an additional electrode 100 to which the $\phi_0$ clock is applied. From FIG. 12 it may be observed that $\phi_0$ is the same as EPT, in a manner analogous to that of the previous embodiment. The various multiple-phase voltages are applied to individual electrodes rather than to electrode pairs. These electrodes may be assumed all to be spaced the same distance from the substrate. The electrodes of the A register are similar; however, there is no electrode comparable to 100.

The system of FIG. 10 is suitable for interlaced operation. During the integration time, switches 130 and 132 are open. In one mode of operation, as soon as the A-to-B register transfer of the "odd field" has been completed, shift register 88 is set by an asynchronous reset pulse applied to a common set terminal for setting all stages ($\phi_{2A}$–$\phi_{nA}$ go high) which the other register 92 is asynchronously reset so that $\phi_{1A}$... $\phi_{(n-1)A}$ are all low. The result is to integrate an even field of charges. After this field has integrated and has been shifted into the B register, shift register 92 is asynchronously set ($\phi_{1A}$–$\phi_{(n-1)A}$ go high) and shift register 88 is asynchronously set ($\phi_{2A}$... $\phi_{nA}$ go low). The result is the integration of an odd field of charges.

Figure 12:
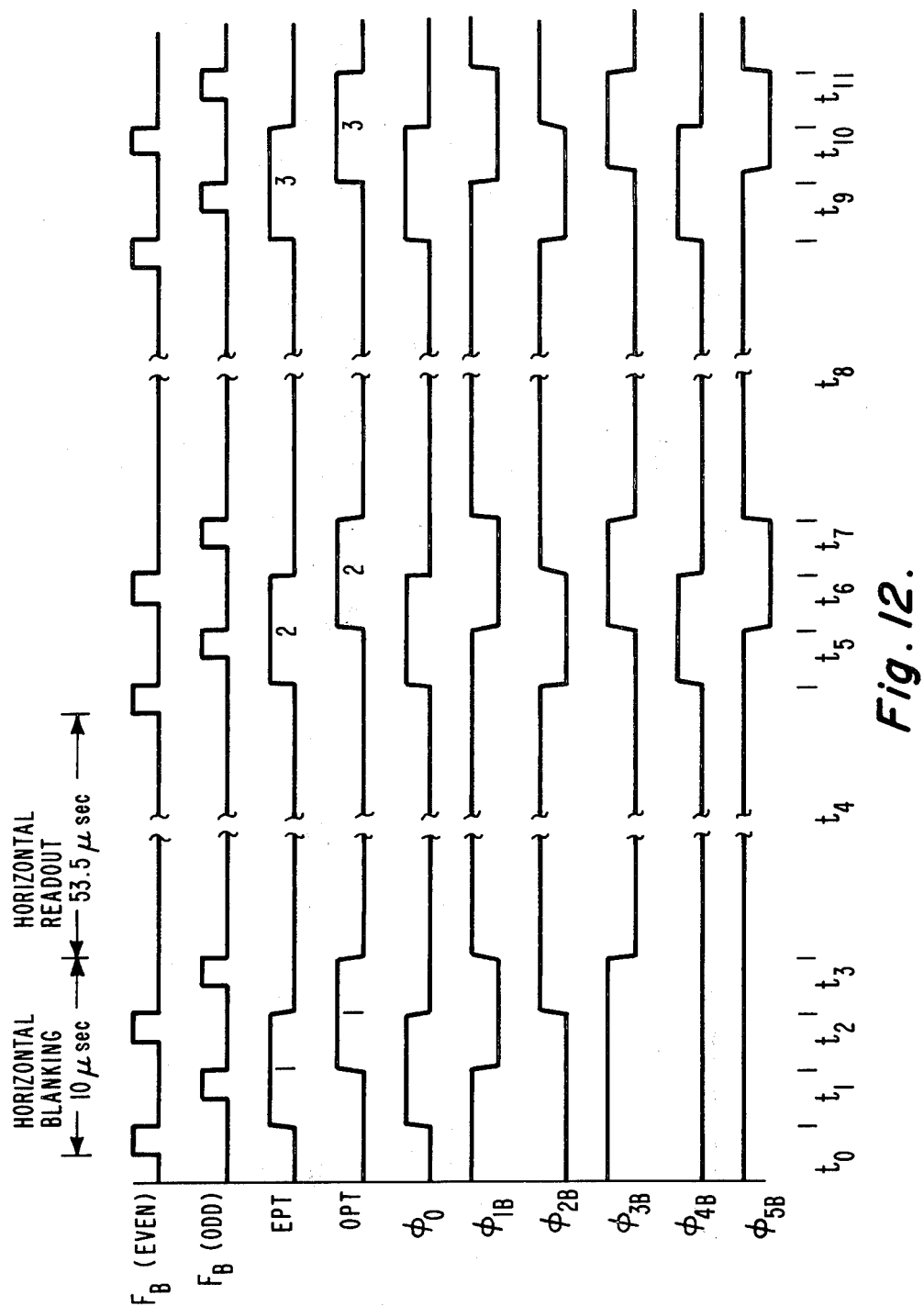
FIG. 12 is a drawing of waveforms employed in the operation of the imager of FIG. 10.

The operation of the system should be easy to follow from FIGS. 11 and 12 in view of the discussion of the previously embodiment. FIG. 11 illustrates the readout of the B register. At time $t_0$ alternate rows of the B register are storing charge. The positive voltages are applied to the $\phi_{1B}$, $\phi_{3B}$... $\phi_{(n-1)B}$ electrodes and the charges previously were integrated under the $\phi_{1A}$, $\phi_{3A}$... $\phi_{(n-1)A}$ electrodes (not shown) of the A register. The field can be considered the "odd" field. At time $t_1$, $\phi_0$ is high as is $\phi_{1B}$ so that the charge packet S1 formerly in potential well 102 now is present in the combined potential well 104 beneath electrodes 100 and 106. At time $t_2$, $\phi_{1B}$ is low and the charge packet S1 has been transferred to the C register by employing appropriate multiple-phase voltages in the C register. At time $t_3$, $\phi_{3B}$ is high as is $\phi_{2B}$ so that the charge packet S2 formerly in potential well 108 beneath electrode 110 is now present in the combined potential well 112 beneath electrodes 110 and 116.

If the charge propagation continues to be followed, it will be seen that the charges initially stored in alternate single rows of the B register separated by alternate empty single rows becomes stored in pairs of rows separated by pairs of empty rows. For example, at time $t_5$, charge packet S2 is stored in the row pair 100, 106, the row pair 110, 114 is empty, and the row pair 116, 118 is storing a charge packet S3 in the combined potential well 120 beneath that pair. After each charge packet $S_j$ becomes separated from the adjacent charge packet $S_{j+1}$ by a pair of rows, the adjacent charge packet $S_j$ and all other charge packets $S_{j-1}$, $S_{j-2}$... which previously have been shifted and are still in the B register, transfer in unison. After the B register has been half emptied, the charges remaining in the B register are stored in alternate pairs of rows of the B register separated by alternate empty pairs of rows in the B register. Thereafter, all row pairs of charges in the B register are moved in unison a distance equal to one row, in response to each change in the multiple phase voltage level, until the last row pair has been read into the C register. This moving of charges in unison in this manner is analogous to what occurs in four-phase operation using overlapping four-phase clock pulses and this is the reason the term "four-phase" is employed to describe the form of operation.

The A-to-B register transfer is not illustrated as it is analogous to the A-to-B register transfer of the previous embodiment. During this transfer, the same shift voltage, call it $F_E=F_A$ EVEN$=F_B$ EVEN, is supplied to both registers 86 and 88 after the switch 130 is closed. In similar fashion, the shift voltage, call it $F_O=F_A$ ODD$=F_B$ ODD is applied to registers 90 and 92 after the switch 132 is closed. The bit pattern stored in 86 shifts into 88 and the bit pattern stored in 90 shifts into 92 in a manner analogous to that described in connection with FIG. 6 and the field in the A register shifts into the B register in a manner analogous to that shown in FIG. 11 until half the field is stored in the A register and half the field is stored in the B register. Then, (after n $F_E$ and n $F_O$ pulses occur) the input data pulses EPT and OPT terminate (with EPT remaining low and OPT remaining high) and as the $F_E$ and $F_O$ pulses continue, the charges begin to become compactly stored in the B register. That is, first the first row (say it is the $\phi_{1A}$ row of an integrated odd field) of charges becomes stored in the $\phi_{1B}$ row of the B shift register. Then the $\phi_{3A}$ row becomes stored in the $\phi_{3B}$ row of the B register. And this continues until by the completion of the 2n'th $F_E$ and $F_O$ shift pulses, the entire odd field is stored beneath the $\phi_{1B}$, $\phi_{3B}$... $\phi_{(n-1)B}$ electrodes of the B register and the A register is empty. Now the readout of the B register can start, and the A register is empty. The integration of the even field can start immediately if the switches 130 and 131 are opened, the shift register 88 is asynchronously set so that $\phi_{2A}$... $\phi_{nA}$ are high, and the shift register 92 is asynchronously reset so that $\phi_{1A}$... $\phi_{(n-1)A}$ are low.

An alternative method for initializing the shift registers 88 and 92 prior to the integration of the even field, is to connect the data input of shift register 88 to a logic 1 level, connect the data input of shift register 92 to a logic 0 level, and then clock these registers with n $F_A$ EVEN and $F_A$ ODD shift pulses.

Other modes of operation for the A-to-B register transfer are also possible. For example, the "odd" field integrated under the odd numbered electrodes in the A register may be stored under the even numbered electrodes in the B register and vice versa. In this case the input data pulses EPT and OPT would terminate with EPT remaining high and OPT remaining low. Switches 130 and 132 could then remain closed in order to initialize the A register for the following even field integration by supplying n $F_E$ and $F_O$ shift pulses after completing the A-to-B register transfer.

The A-to-B register transfer just described takes place during the vertical retrace time of television and the B-to-C register transfer previously described takes place during the field time of television just as in the previous embodiment; however, here there is vertical interlace. The field time for vertical interlace is 1/60 sec. per field, 1/30 sec. per frame, as contrasted to the 1/30 sec. per field of the previous embodiment.

As in the previous example, in the FIG. 10 embodiment the vertical resolution obtained is much higher than that of the conventional four-phase CCD imager of the field transfer type. In FIG. 10, during integration, charges are stored, for example, beneath the $\phi_{2A}$, $\phi_{4A}$, $\phi_{6A}$ and so on electrodes. One resolution element of one field is equal to the length (dimension in the charge transfer direction) of two electrodes ($\phi_{1A}$ $\phi_{2A}$, for example) that is, the vertical resolution is not greater than the length in the column direction of two rows. The apparent resolution of one interlaced frame is approximately double that of a field, that is, the apparent size of one resolution element is $\frac{1}{2}$ that of a field. In a conventional four-phase system, in every group of four adjacent rows, charge is integrated under two rows and two rows remain empty. Thus, the size of a resolution element for one field in the prior art is equal to the length of four electrodes which is double that the present arrangement.

While the present invention has been described in connection with the readout of a particular form of CCD imager, it can be employed for the readout of other kinds of densely packed CCD arrays.

What is claimed is:

1. In a charge-coupled device (CCD) which includes a substrate and overlying electrode means insulated from the substrate for creating potential wells in the substrate for the propagation and storage of signal charge packets in response to applied voltages, and in which there are initially stored in n adjacent ones of said potential wells each separated from an adjacent potential well by a space only occupied by a potential barrier in said substrate created by a single one of said electrode means, n signal charge packets $S_1, S_2 ... S_n$, respectively, and in which it is desired to shift said signal charge packets in a direction such that the charge packet $S_1$ is the leading or first charge packet and $S_n$ the last charge packet, a method for shifting the charges comprising the steps of applying potentials to said electrode means for:

(a) starting with the signal charge packet $S_j = S_1$, sequentially, successively shifting during n successive time periods, the n successive charge packets $S_1, S_2 ... S_n$, respectively, each such signal charge packet $S_j$ being shifted, when its turn arrives, from a position separated from the adjacent succeeding charge packet $S_{(j+1)}$ by the barrier created by only one of said electrode means, to a position further from said adjacent succeeding charge packet $S_{(j+1)}$ and separated from said adjacent succeeding charge packet $S_{(j+1)}$ by a space sufficient for accommodating both a potential well formed by a potential applied to an overlying electrode means into which a signal charge packet can flow and a potential barrier formed by a potential applied to another overlying electrode means; and (b) when each signal packet $S_j$ is shifted to the position described in (a) above, concurrently shifting through an equal distance, in the same direction, the preceding signal charge packets $S_{(j-1)}, S_{(j-2)} ... , S_1$, if any such charge packets $S_{(j-1)} ... S_1$ are present.

2. In a method as set forth in claim 1, the further steps, after said n successive time periods, of applying potentials to said electrode means during n successive additional time periods for:

(c) starting with the first signal charge packet $S_1$, statically storing that charge packet; and (d) concurrently shifting all of the remaining charge packets as described in (b) above and each time a charge packet $S_j$ reaches a position adjacent to a statically stored charge packet $S_{j-1}$, shifting $S_j$ closer to $S_{j-1}$ and statically storing it in a potential well separated from $S_{j-1}$ by a space only occupied by a potential barrier created by a single one of said electrode means.

3. In a method as set forth in claim 1 or claim 2, each electrode means comprising solely two electrodes, one a storage electrode and the other a transfer electrode, the storage electrode forming a deeper potential well in the substrate than its associated transfer electrode during operation and the storage electrode preceding the transfer electrode in the charge transfer direction.

4. In a method as set forth in claim 1 or claim 2, each electrode means comprising solely a single electrode.

5. In a method as set forth in claim 1, said CCD comprising an imager, the initial storage of said charges occurring during an integration time in response to light excitation, the further step, during a following integration time, of storing charges in n different potential wells in said substrate in positions interlaced with those occupied by charges during the preceding integration time and separated by one another by potential barriers in said substrate.

* * * * *